United States Patent [19]

Bethea et al.

[11] Patent Number: 4,894,526

[45] Date of Patent: Jan. 16, 1990

[54] INFRARED-RADIATION DETECTOR DEVICE

[75] Inventors: Clyde G. Bethea, Plainfield; Kwong-Kit Choi, North Plainfield; Barry F. Levine, Livingston; Roger J. Malik, Summit; John F. Walker, Westfield, all of N.J.

[73] Assignee: American Telephone and Telegraph Company, AT&T Bell Laboratories, Murray Hill, N.J.

[21] Appl. No.: 97,567

[22] Filed: Sep. 15, 1987

Related U.S. Application Data

[63] Continuation-in-part of Ser. No. 4,191, Jan. 15, 1987.

[51] Int. Cl.⁴ .............................................. H01J 40/14
[52] U.S. Cl. ............................ 250/211 R; 250/370.01; 250/370.08; 250/370.12; 357/4; 357/30
[58] Field of Search ................................. 357/4, 6, 30; 250/370.01, 370.08, 370.12, 211 R, 211 J

[56] References Cited

U.S. PATENT DOCUMENTS

| 4,525,731 | 6/1985 | Chappell et al. | 357/4 |
| 4,561,005 | 12/1985 | Shannon | 357/4 |
| 4,581,621 | 4/1986 | Reed | 357/6 |
| 4,607,272 | 8/1986 | Osbourn | 357/4 |
| 4,620,214 | 10/1986 | Margalit et al. | 357/4 |

Primary Examiner—Edward P. Westin
Assistant Examiner—Khaled Shami
Attorney, Agent, or Firm—Peter A. Businger

[57] ABSTRACT

A narrow-bandwidth, high-speed infrared radiation detector is based on tunneling of photo-excited electrons out of quantum wells. Infrared radiation incident on a superlattice of doped quantum wells gives rise to intersubband resonance radiation which excites electrons from the ground state into an excited state. A photocurrent results from excited electrons tunneling out of quantum wells. Conveniently, Group III-V materials can be used in device manufacture. Preferably, quantum well potential barriers are shaped so as to facilitate resonant tunneling of photocurrents as compared with dark current. Preferred device operation is at elevated bias voltage, giving rise to enhancement of photocurrent by a quantum-well-avalanche effect.

22 Claims, 5 Drawing Sheets

INCIDENT ELECTRON ENERGY $E_k$(meV)

--→ PHOTOCURRENT

↕ INFRARED ABSORPTION

INFRARED-RADIATION DETECTOR DEVICE

CROSS-REFERENCE TO RELATED APPLICATION

This is a continuation-in-part application of application Ser. No. 004,191, filed Jan. 15, 1987.

TECHNICAL FIELD

The invention is concerned with radiation detection devices and, more specifically, with radiation detection which are sensitive to infrared radiation.

BACKGROUND OF THE INVENTION

High-speed radiation detection devices are of interest in a variety of fields such as, e.g., optical communications, image sensing, and measurement and instrumentation; devices may be sensitive to particle radiation or, as in the following, to electromagnetic radiation. Of particular interest are wavelength-selective devices which are capable of following a rapidly changing signal such as, e.g., a train of pulses in which pulse duration is on the order of a few tens of picoseconds.

In the case of infrared radiation, high-speed detector devices are particularly useful, e.g., for satellite communications, terrain mapping, and infrared viewing. Devices in current use in these fields of application are largely based on the material mercury cadmium telluride, cooled with liquid nitrogen. However, this material is not easy to fabricate, and the material may be unsatisfactory with respect to long-term stability. While doped silicon also represents a possible infrared-radiation-sensitive medium, cooling to still lower temperatures is required. Also, the response of silicon-based devices is considered to be unsatisfactory for high-speed applications.

Experimental devices have been proposed as predicted on optoelectronic effects in compound-semiconductor materials, Group II–VI and Group III–V materials being considered as particularly suitable in this respect. For example, the paper by D. D. Coon et al., "New Mode of IR Detection Using Quantum Wells", *Applied Physics Letters,* Vol. 45 (1984), pp. 649–651 discloses infrared radiation detection based on charge-depletion in localized impurity levels in semiconductors to which an electric field is applied. Charge-depletion takes the form of photoemission from a single $Al_xGa_{1-x}As/GaAs/Al_yGa_{1-y}As$ asymmetric quantum well.

Use of a plurality of GaAs/GaAlAs quantum wells is disclosed in the paper by J. S. Smith et al., "A New Infrared Detector Using Electron Emission from Multiple Quantum Wells", *Journal of Vacuum Science and Technology,* Vol. B1 (1983), pp. 376–378. Here, electrons are ejected from quantum wells upon excitation by free-carrier absorption, giving rise to a flow of electric current.

A superlattice consisting of a plurality of $GaAs/Ga_xAl_{1-x}As$ quantum wells is disclosed also in the paper by L. Esaki et al., New Photoconductor", *IBM Technical Disclosure Bulletin,* Vol. 20 (1977), pp. 2456–2457. In the disclosed structure, electrons in the lowest sub-band of quantum wells are essentially immobile, while electrons in a second subband have significant mobility.

SUMMARY OF THE INVENTION

A device comprising a semiconductor heterostructure superlattice comprising doped quantum wells having at least two bound states forms an infrared radiation detection device. Infrared radiation incident on the superlattice gives rise to intersubband absorption which excites electrons from the ground state into an excited state. A photosignal results as the photo-excited electrons tunnel out of the well, thereby producing a current.

In a preferred device embodiment, and in the interest of enhanced device sensitivity, the compositional profile of quantum well potential barriers is chosen such that tunneling of electrons constituting dark current is impeded as compared with photocurrent. Furthermore, in the interest of high device responsivity, preferred device operation involves use of elevated bias voltage, resulting in a disproportionate increase in photocurrent as may be interpreted in terms of quantum-well-avalanche enhancement.

DETAILED DESCRIPTION

1. Basic Features

Figure 1:
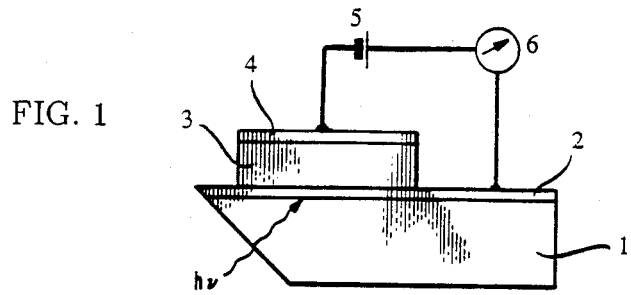
FIG. 1 is a schematic representation, greatly enlarged, of the structure of an infrared radiation detector in accordance with the invention in a simple test arrangement which further includes a voltage source and a current measuring device.
Figure 2:
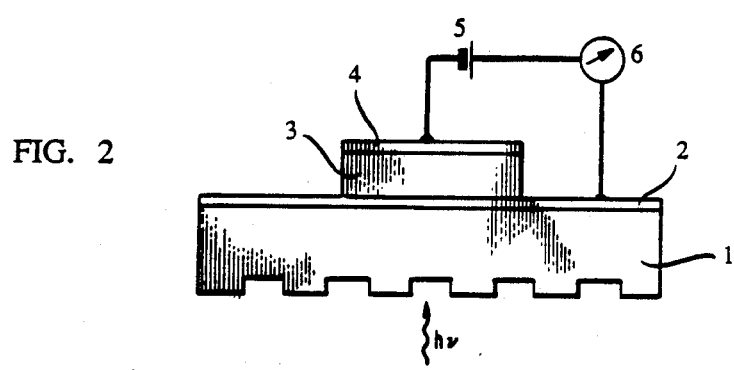
FIG. 2 shows a structure including a diffraction grating, representing an alternative to the structure shown in FIG. 1.

FIGS. 1 and 2 show semi-insulating substrate 1, contact layer 2, semiconductor superlattice 3, contact layer 4, voltage source 5, and electrical current measuring instrument 6 connected, in series with voltage source 5, to contact layers 2 and 4.

In FIG. 1, illumination of the superlattice is shown at an angle via a polished face of the substrate as was found convenient for experimental device evaluation. More generally, illumination may be in any direction having an optical-electric field component perpendicular to the superlattice planes; e.g., as shown in FIG. 2, a diffraction grating can be used for this purpose. Also, as is apparent from the mesa geometry of the device of FIGS. 1 and 2, devices of the invention can be made to form arrays as may be suitable for imaging applications.

Figure 3:
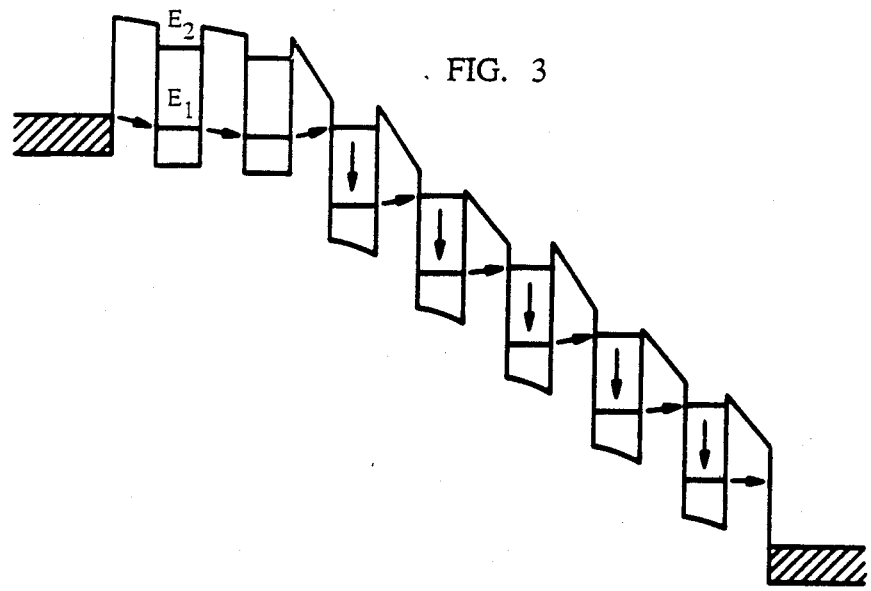
FIG. 3 is an energy band diagram corresponding to a device in accordance with the invention in the presence of a bias field.
Figure 4:
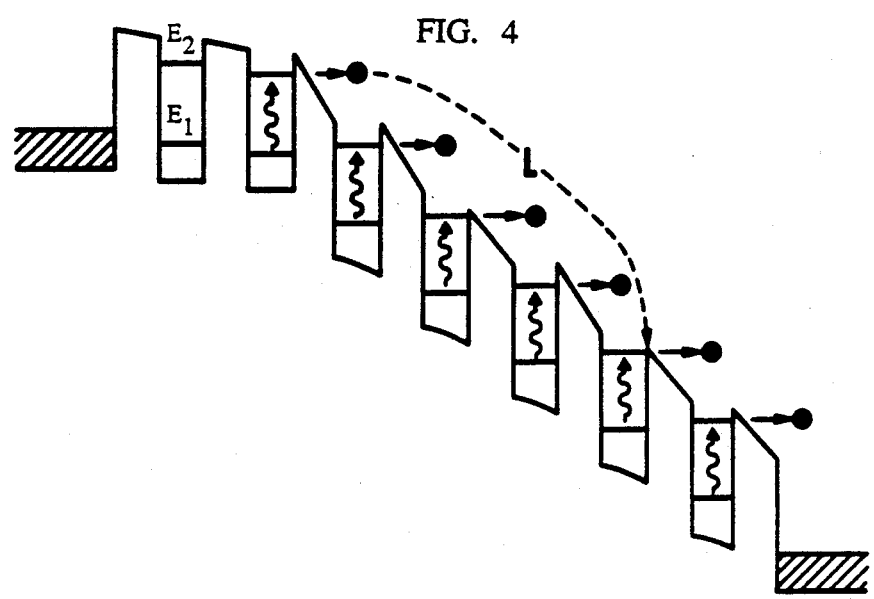
FIG. 4 is an energy band diagram corresponding to a device in accordance with the invention in the presence of a bias field and under illumination by infrared radiation.

Functioning of a specific preferred embodiment of a photodetector in accordance with the invention may be more readily appreciated with reference to energy band diagrams as shown in FIGS. 3 and 4, where quantum wells are shown having two confined states. In the presence of a bias voltage exceeding the ground state bandwidth, tunneling through the ground states is diminished, and the structure breaks up into a low-field region (left side of FIG. 3) and a high-field region (right side of FIG. 3) in which electrons flow via sequential resonant tunneling from the localized ground state $E_1$ of one well to the localized excited state $E_2$ of the neighboring well. (A survey of resonant tunneling and related effects can be found in the paper by F. Capasso et al., "Resonant Tunneling Through Double Barriers, Perpendicular Quantum Transport Phenomena in Superlattices, and Their Device Applications", *IEEE Journal of Quantum Electronics*, Vol. QE-22 (1986), pp. 1853-1869.)

Electrons then relax back to $E_1$ and tunnel into the next well as indicated by arrows in FIG. 3. As the bias voltage is increased further, the high-field region expands by one wall at a time, thereby producing periodic negative conductance peaks with a period of $\Delta E = (E_1 - E_2 - \Delta \nu_1 - \Delta \nu_2)$, where $\Delta \nu_1$ and $\Delta \nu_2$ are the widths of $E_1$ and $E_2$, respectively.

With reference to FIG. 4 which illustrates device operation under illumination, infrared light which is in resonance with the intersubband transition $(E_2-E_1)$ excites an electron from the doped ground state $E_1$ to the excited state $E_2$ from which it can tunnel out of the well through the thin top of the barrier. This photo-generated hot electron then travels a mean free path L, thereby generating a photocurrent before being recaptured by one of the wells.

More generally, and whether or not device operation involves resonant tunneling, a device in accordance with the invention is characterized by a heterostructure semiconductor superlattice comprising at least one doped quantum well which has at least two confined states, the more energetic of such states being sufficiently elevated to permit tunneling of electrons out of the quantum well in the presence of a bias field applied to the superlattice. Depending on superlattice geometry, and depending especially on well and barrier thicknesses, the bias field may produce essentially equal steps between quantum wells as illustrated in FIGS. 3 and 4, thereby producing an essentially linear quantum well profile. However, other profiles such as, e.g., parabolic profiles or superpositions of parabolic and linear profiles can be used. (Such nonlinear profile may result, e.g., when barrier layers in a superlattice are chosen thick enough to minimize dark current.)

Frequency selectivity of devices in accordance with the invention depends on the intersubband transition energy, $E_2-E_1$, which largely depends on the choice of superlattice material and well thickness. Choice may be from among known compound semiconductor materials, resulting in detector response at frequencies corresponding to wavelengths greater than approximately 2 micrometers and up to 100 micrometers and beyond. For example, in the case of a superlattice consisting of alternating layers of gallium arsenide and gallium aluminum arsenide, selected frequency is directly related to the amount of aluminum included per formula unit. Among other suitable material combinations are indium phosphide and indium gallium arsenide phosphide, and gallium antimonide and aluminum gallium antimonide. While use of Group II-VI compound semiconductor materials is not precluded, Group III-V materials are preferred in the interest of device manufacturing convenience.

N-type doping of quantum wells is preferred in compound-semiconductor materials in the interest of taking advantage of high electron mobility. Doping may be with silicon or with tin at levels of concentration of $10^{18}$ to $10^{19}$ cm$^{-3}$, such high levels of dopant concentration being desirable in the interest of high absorption. Alternatively, barriers may be doped as in modulation doping. Further in the interest of high absorption, the number of quantum wells in a superlattice is preferably chosen sufficiently large to assure absorption of all (or at least of a significant portion) of radiation of interest.

Device manufacture typically involves superlattice fabrication on a substrate under highly controlled conditions as realized, e.g., in molecular beam epitaxy (MBE) or metal-organic chemical vapor deposition (MOCVD) technologies. As surveyed, e.g., by A. Cho, "Recent Developments in III-V Compound Semiconductor Materials and Devices", in: J. D. Chadi et al., ed., *Proceedings of the* 17th International Conference on the Physics of Semiconductors, Springer-Verlag, 1985, pp. 1515-1524, MBE and MOCVD fabrication techniques are well-known in a variety of fields including the field of compound-semiconductor device manufacture. See also, e.g., R. D. Dupuis, "Metalorganic Chemical Vapor Deposition of III-V Semiconductors", *Science*, Vol. 226 (1984), pp. 623-629.

Among advantageous features of devices in accordance with the invention are a narrow resonance, low background noise, high quantum efficiency, and strong photoelectric current. The following Example provides dimensions and material compositions as can be used to make one specific device in accordance with the invention; given also are performance characteristics as illustrative of advantageous device features. All measures are nominal or approximate.

EXAMPLE

On a gallium arsenide substrate, a 1-micrometer layer of GaAs, doped $n^+ = 4 \times 10^{18}$/cm$^3$, was deposited as a contact layer. On the contact layer a 50-period superlattice of alternating layers was deposited, alternating between 65 Angstroms GaAs (doped $n = 1.4 \times 10^{18}$/cm$^3$), and 98 Angstroms Al$_{0.24}$Ga$_{0.76}$As. On the superlattice, a 0.5-micrometer GaAs contact layer was deposited, doped $n^+ = 4 \times 10^{18}$/cm$^3$. (These thicknesses and compositions were chosen to produce exactly two states in the well, with an energy spacing close to 10 micrometers.)

Fourier transform interferometer absorption measurements were carried out with the superlattice at Brewster's angle (73 degrees in this case) for the sake of determining resonance energy and oscillator strength. An absorption peak was found near 920 cm$^{-1}$, and oscillator strength was determined to be approximately $f=0.6$.

In order to measure the infrared photoconductivity, a detector was fabricated by etching a 50-micrometer-diameter mesa and making ohmic contact to the top and bottom n$^+$-GaAs layers. Low-temperature dark current was 2.5 mA (T=15 degrees K. to 80 degrees K.), and the differential resistance at the operating bias voltage of 2.6 V was 175 ohms. A 45-degree angle was polished on the substrate to allow for back-illumination of the detector with infrared light at a 45-degree angle of incidence, thus allowing for a large optical field normal to the superlattice. 10-micrometer radiation was obtained using a CO$_2$ laser, tunable from 929 cm$^{-1}$ (10.8 micrometers) to 1088 cm$^{-1}$ (9.2 micrometers). The CO$_2$ laser was normalized to a reference detector and also highly attenuated so that power levels less than 10 microwatts were incident on the active device area. The photocurrent signal was measured using a 10-ohm load resistor and was found to be independent of temperature from T=15 degrees K. to 80 degrees K. The strongly resonant character of the photocurrent was in close agreement with the measured absorption spectrum. Furthermore, as expected, the photosignal was determined to be highly polarized with the optical transition dipole moment aligned normal to the superlattice. The response speed of the detector was checked and found to be less than 10 microseconds as limited by the maximum CO$_2$ laser chopper wheel speed.

Figure 5:
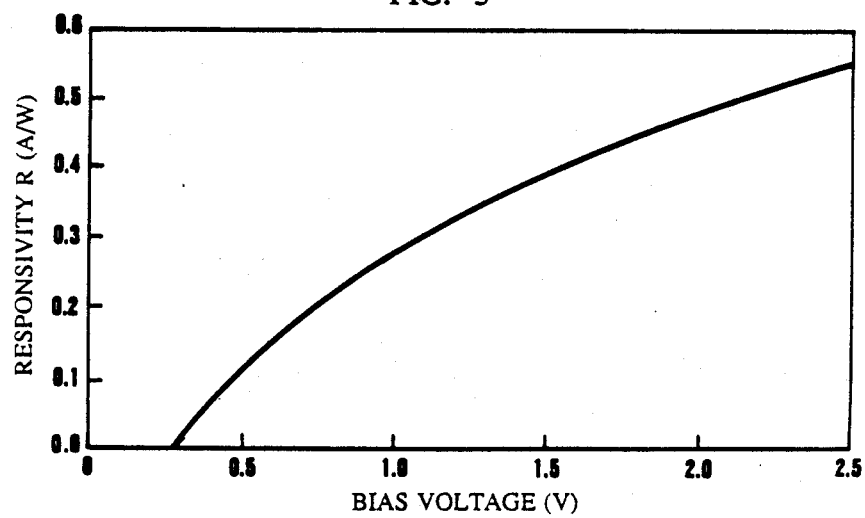
FIG. 5 is a graphic representation of a functional relationship between bias voltage and photodetector responsivity as experimentally determined for a device of the invention.

Device responsivity as a function of bias voltage is graphically represented in FIG. 5, as experimentally obtained using 10.8-micrometer radiation. Device temperature was 80 degrees K. At an operating bias voltage of 2.6 V, device responsivity was 0.52 A/W, bandwidth response $\Delta\lambda/\lambda$ was about 10 percent, $\Delta\nu=97$ cm$^{-1}$, estimated speed about 45 picoseconds, and mean free path of hot electrons through the superlattice was about L=2500 Angstroms.

It is estimated that overall quantum efficiency can be significantly improved by increasing the net optical absorption and by extending the mean free path. Dark current is indirectly related to the widths of the gallium aluminum arsenide barriers and may also be affected by the shape of such barriers.

2. Additional Features

Figure 6:
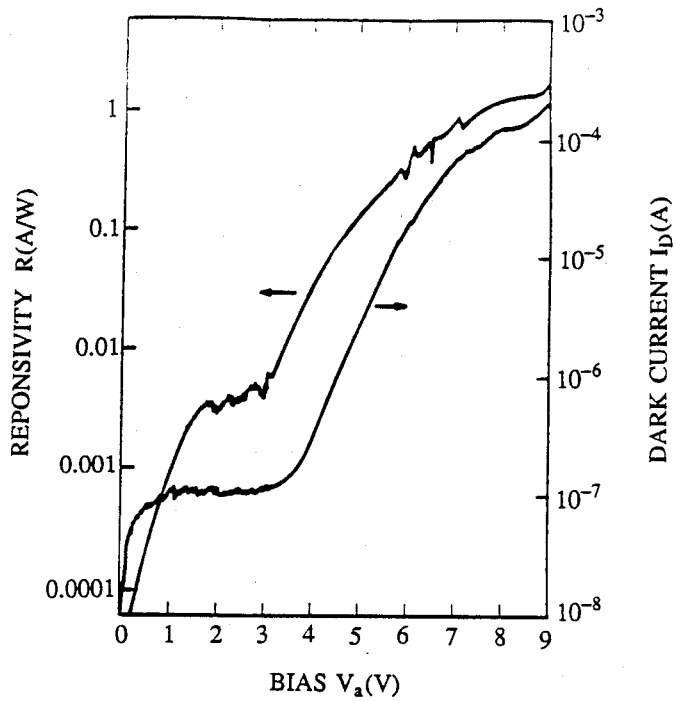
FIG. 6 is a graphic representation of functional relationships between bias voltage and photodetector responsivity, and bias voltage and dark current as experimentally determined for a second device of the invention in which quantum-well barrier widths and heights had been optimized as compared with the device of FIG. 5.

In the interest of reducing the dark current at higher bias voltages, a device similar to the device described in the Example above was made with thicker and higher barriers. This device comprises 50 periods of 70-Angstrom GaAs wells (doped $n=1.4\times10^{18}$/cm$^3$) and 140-Angstrom Al$_{0.36}$Ga$_{0.64}$As undoped barriers. Top and bottom gallium arsenide contact layers were used having respective thicknesses of 0.5 micrometer and 1 micrometer, and having a dopant concentration $n^+=3\times10^{18}$/cm$^3$. Photodetector responsivity as measured at a temperature of 15 degrees K. and for a wavelength of 10.3 micrometers is graphically shown in FIG. 6.

As contrasted with the device of the Example above, the bias voltage now could be increased further, thereby increasing the photoexcited tunneling probability. Specifically, at a bias voltage of 9 V, responsivity was approximately 1.9 A/W, and mean free path of hot electrons was greater than 1 micrometer.

Figure 7:
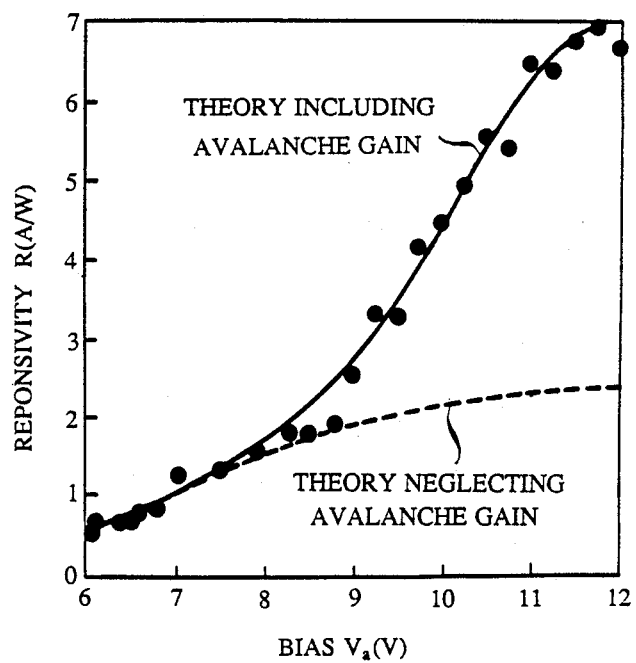
FIG. 7 is a graphic representation of a functional relationship between bias voltage and photodetector responsivity as experimentally determined for a third device of the invention very similar to the device of FIG. 6, measurements extending to bias voltages considerably higher than those of FIG. 6.

While such increased responsivity resulting from optimized barrier heights and widths may be regarded as essentially as expected, a decidedly unexpected increase in responsivity was observed at yet higher bias voltages applied to this same device comprising 50 periods of 70-Angstrom GaAs quantum wells, doped $n=1.4\times10^{18}$/cm$^3$, and 140-Angstrom Al$_{0.36}$Ga$_{0.64}$As undoped barriers. Measurements made at a wavelength of 10.3 micrometers are displayed in FIG. 7 which clearly shows a dramatic increase in responsivity at bias voltages beyond 9 V.

Figure 8:
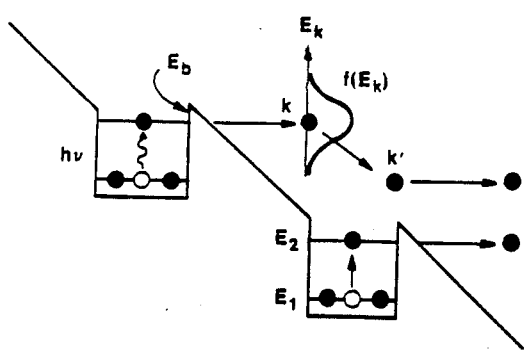
FIGS. 8 and 9 are energy band diagrams illustrating an interpretation of enhancement of photocurrent in terms of an avalanche effect at elevated bias voltage.
Figure 9:
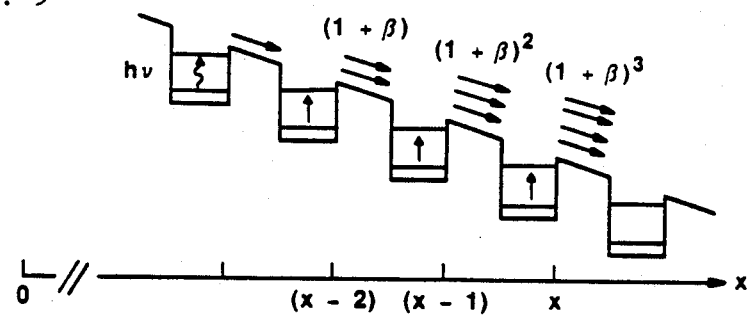

For the sake of interpretation of such unexpectedly high responsivity at elevated bias voltages, a gain mechanism is proposed in terms of photoelectron-initiated avalanche ionization of electrons out of quantum wells. This process is graphically illustrated in FIG. 8 where a photogenerated electron having wave vector k (in the superlattice growth direction) and energy $E_k$ (measured from the conduction band edge of the barrier) is incident on the neighboring quantum well which contains bound electrons in the ground state $E_1$. After interaction via the Coulomb potential, the incident electron loses energy and momentum, resulting in the new values k' and $E_{k'}$, while the bound electron is promoted, e.g., to the first excited state $E_2$. The excited electron can then tunnel out, thereby producing gain. Sequential repetition of this process in superlattice quantum wells is illuatrated by FIG. 9 ($\beta$ denoting the ionization rate).

Figure 10:
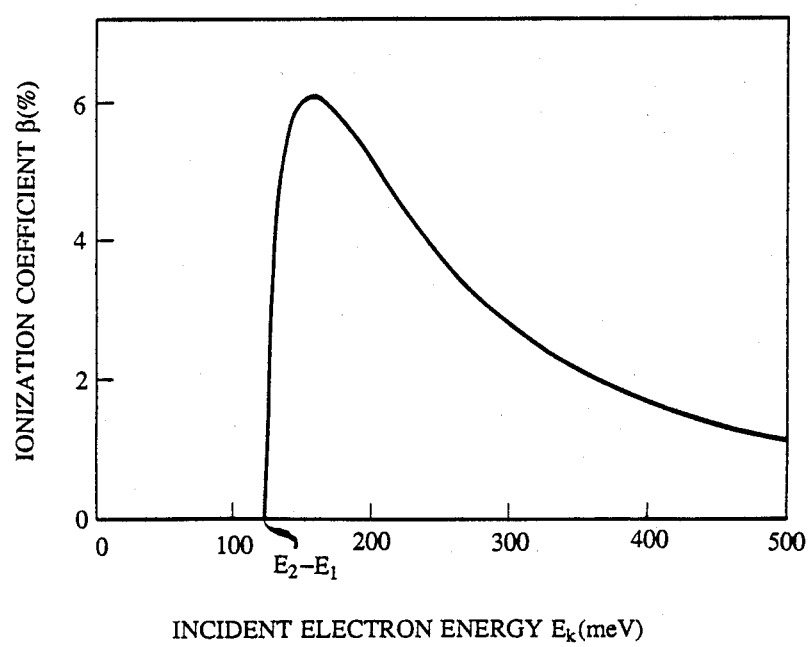
FIG. 10 is a graphic representation of a functional relationship between energy of elctrons incident on a quantum well and ionization coefficient.

Avalanche gain in accordance with this preferred embodiment of the invention is being realized when the applied bias field is sufficiently strong to produce a voltage drop greater than $E_2-E_1$ per period of the superlattice. As determined from a mathematical model of the avalanche process, the ionization coefficient $\beta$ depends on incident electron energy as shown in FIG. 10, the peak of the curve being at or near 1.25 times ($E_2-E_1$). Accordingly, in the interest of maximizing $\beta$, a bias field may be chosen to produce such approximate preferred voltage drop per period of the superlattice.

In connection with avalanche effects in superlattices generally, it is noted that an effect of this type has been described by F. Capasso et al., "New Avalanche Multiplication Phenomenon in Quantum Well Superlattices: Evidence of Impact Ionization Across the Band-edge Discontinuity", *Applied Physics Letters*, Vol. 48 (1986), pp. 1294-1296. As contrasted with ionization across the bandgap as disclosed there, we here are proposing a different, intersubband effect at infrared energies.

Figure 11:
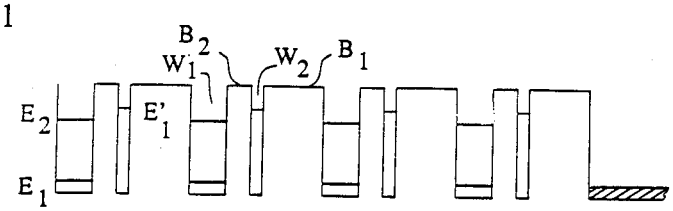
FIG. 11 is an energy band diagram corresponding to a device in accordance with the invention in the absence of a bias field, the energy profile having been chosen for reduced dark current.
Figure 12:
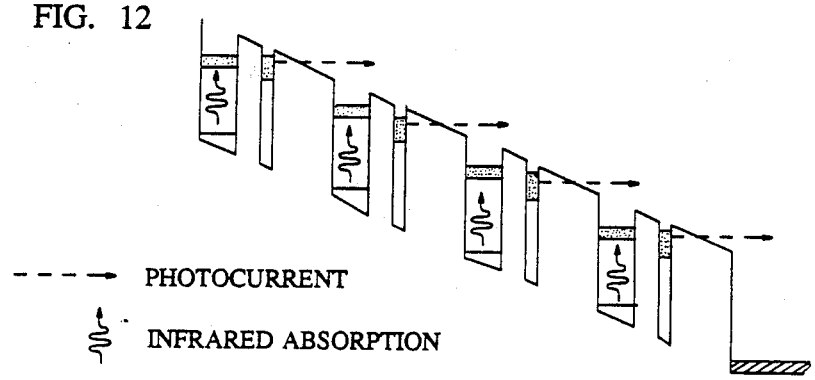
FIG. 12 is an energy band diagram corresponding to the diagram of FIG. 11, but now in the presence of a bias field.
Figure 13:
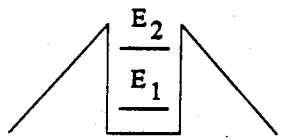
FIGS. 13–16 are diagrams of quantum well energy profiles in the absence of a bias field, representing alternatives for the reduction of dark current.
Figure 14:
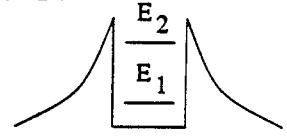
Figure 15:
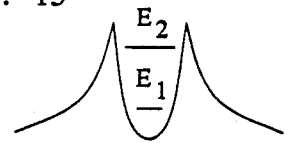
Figure 16:
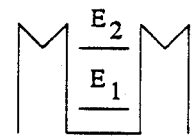

Further in the interest of minimizing the dark current of a photodetector device of the invention, a superlattice structure was grown by molecular beam epitaxy to comprise 50 periods of 75 Angstroms GaAs (doped $n=10^{18}$/cm$^3$), 39 Angstroms Al$_{0.33}$Ga$_{0.67}$As, 18 Angstroms undoped GaAs, and 154 Angstroms undoped Al$_{0.33}$Ga$_{0.67}$As, sandwiched between gallium arsenide contact layers doped $n^+=3\times10^{18}$/cm$^3$; the band diagram of this structure is as shown in FIGS. 11 and 12. In this structure, each period consists of a thicker well ($W_1$), a thinner well ($W_2$), a thicker barrier ($B_1$), and a thinner barrier ($B_2$). For the uncoupled wells there are two states ($E_1=44$ meV, $E_2=170$ meV) in $W_1$, and only one state ($E_1'=174$ meV) in $W_2$, these energies being chosen such that, when the superlattice is electrically biased, resonant tunneling of photoelectrons at level $E_2$ is facilitated as the energy of the single state in $W_2$ now matches $E_2$. Resulting ease with which photocurrent are transmitted is contrasted with essential blockage of dark-current electrons as the well $W_2$ does not provide for a resonant state matching $E_1$.

In the case of our double-barrier superlattice photodetector as described above, the dark current was less than 1 percent of that achieved using ordinary, square tunneling barriers, and the responsivity was essentially the same. Thus, the new structure is particularly suited for high-sensitivity detectors.

Effective also for inhibiting dark current are graded barrier profiles which result in greater barrier thickness at the dark-current energy level as compared with thickness at the photocurrent energy level; see FIGS. 13-16 for examples of this approach.

We claim:

1. A device comprising an infrared-radiation detector, said detector comprising a substrate-supported heterostructure superlattice comprising semiconductor layers forming a plurality of quantum wells doped for one and the same conductivity type, at least one of said quantum wells having at least two confined states and having an adjoining first barrier which permits tunneling of photo-excited carriers out of said quantum well, subsequent transport of said carriers being at energies above the barrier-top energy of a second barrier, and contact means for electrically biasing said superlattice and for sensing an electrical signal in response to radiation incident on said superlattice.

2. The device of claim 1 in which said quantum wells have two confined states.

3. The device of claim 1 in which, in the presence of a bias field, at least a portion of said quantum wells forms an essentially linear sequence of energies.

4. The device of claim 1 in which, in the presence of a bias field, at least a portion of said quantum wells forms a sequence of energies having a parabolic component.

5. The device of claim 1 in which the energy level of a first state of a first quantum well is essentially equal to the energy level of a second state in a second quantum well, said second quantum well being adjacent to said first quantum well.

6. The device of claim 1 in which said semiconductor layers are compound-semiconductor layers.

7. The device of claim 6 in which said compound-semiconductor layers are Group III-V semiconductor layers.

8. The device of claim 7 in which said superlattice consists essentially of alternating layers of gallium arsenide and gallium aluminum arsenide.

9. The device of claim 7 in which said superlattice consists essentially of alternating layers of indium phosphide and indium gallium arsenide phosphide.

10. The device of claim 7 in which said superlattice consists essentially of alternating layers of gallium antimonide and aluminum gallium antimonide.

11. The device of claim 7 in which said quantum wells are n-doped.

12. The device of claim 7 in which said superlattice is modulation-doped.

13. The device of claim 1, said device comprising a plurality of photodetectors.

14. The device of claim 13, said plurality of photodetectors forming an array.

15. The device of claim 1, said quantum wells having potential barriers whose compositional profile is chosen to favor resonant tunneling of photocurrent as compared with dark current.

16. The device of claim 15, said barriers having a graded compositional profile.

17. The device of claim 16, grading of said profile being essentially linear.

18. The device of claim 16, grading of said profile being essentially parabolic.

19. The device of claim 16, grading of said profile being essentially M-shaped.

20. The device of claim 16, pairs of quantum wells being such that resonant tunneling is facilitated for photocurrent electrons by matching energy levels, and impeded for dark current electrons by lack of energy level matching.

21. A method for detecting infrared radiation, said method comprising making said radiation incident on a substrate-supported heterostructure superlattice comprising semiconductor layers forming a plurality of quantum wells doped for one and and the same conductivity type, at least one of said quantum wells having at least two confined states and having an adjoining first barrier which permits tunneling of photo-excited carriers out of said quantum well, subsequent transport of said carriers being at energies above the barrier-top energy of a second barrier, electrically biasing said superlattice such that the voltage across said at least one quantum well is greater than the energy difference between said confined states, and sensing a current flowing through said superlattice.

22. The method of claim 21, said voltage being equal or approximately equal to 1.25 times said energy difference.

* * * * *